(12) United States Patent  (10) Patent No.: US 7,817,475 B2
Lowrey  (45) Date of Patent: Oct. 19, 2010

(54) METHOD AND APPARATUS FOR ACCESSING A PHASE-CHANGE MEMORY

(75) Inventor: Tyler Lowrey, Rochester Hills, MI (US)

(73) Assignee: Ovonyx, Inc., Rochester Hills, MI (US)

( * ) Notice: Subject to any disclaimer, the term of this patent is extended or adjusted under 35 U.S.C. 154(b) by 353 days.

(21) Appl. No.: 11/999,419

(22) Filed: Dec. 5, 2007

(65) Prior Publication Data

US 2009/0147565 A1  Jun. 11, 2009

(51) Int. Cl.
*G11C 16/06* (2006.01)

(52) U.S. Cl. .................. 365/185.19; 365/163; 365/100; 365/148; 365/189.09; 365/185.24

(58) Field of Classification Search ............ 365/185.19, 365/163, 100, 189.09, 185.24, 148
See application file for complete search history.

(56) References Cited

U.S. PATENT DOCUMENTS 7,630,263 B2 * 12/2009 Pio .................... 365/210.1
2006/0164898 A1 * 7/2006 Pio ...................... 365/210

* cited by examiner

*Primary Examiner*—Thong Q Le
(74) *Attorney, Agent, or Firm*—Kevin L. Bray

(57) ABSTRACT

Fixed-voltage programming pulses are employed to program a phase change memory cell. A burst of incrementally widening fixed-voltage programming pulses may be employed to program a phase change memory to a target threshold voltage.

33 Claims, 6 Drawing Sheets

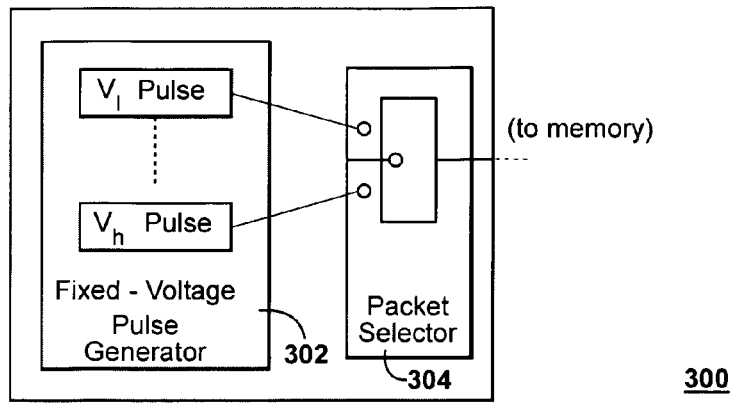
FIG - 3
FIG - 4A
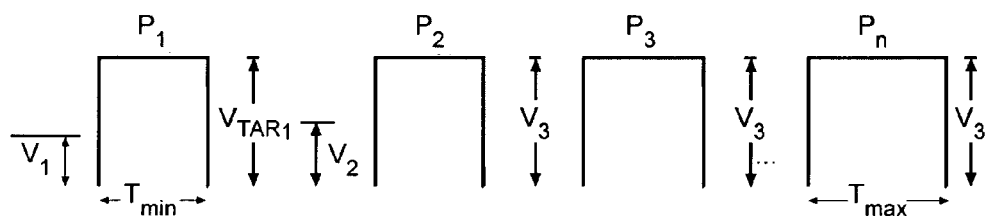
FIG - 4B
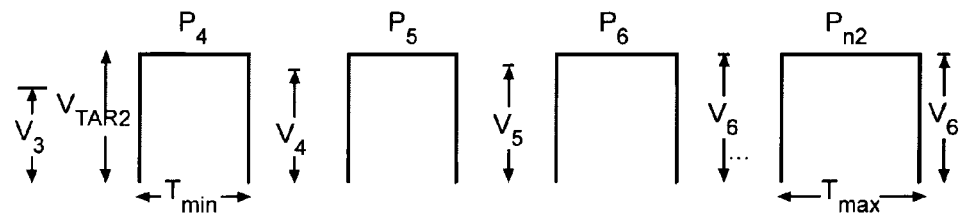

FIG - 4C
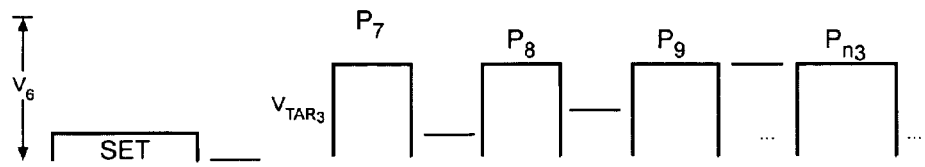
FIG - 4D
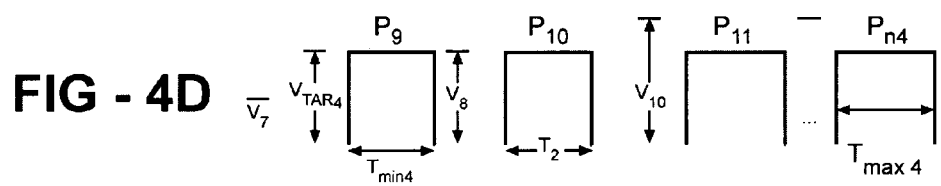
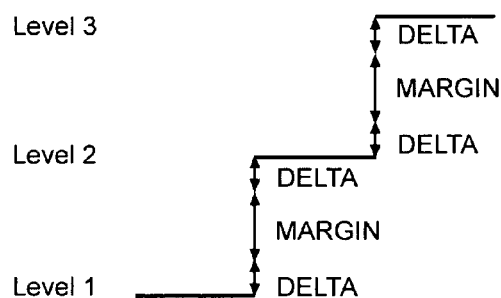
FIG - 5
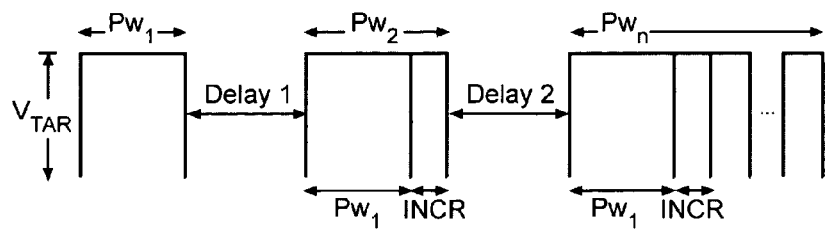
FIG - 6

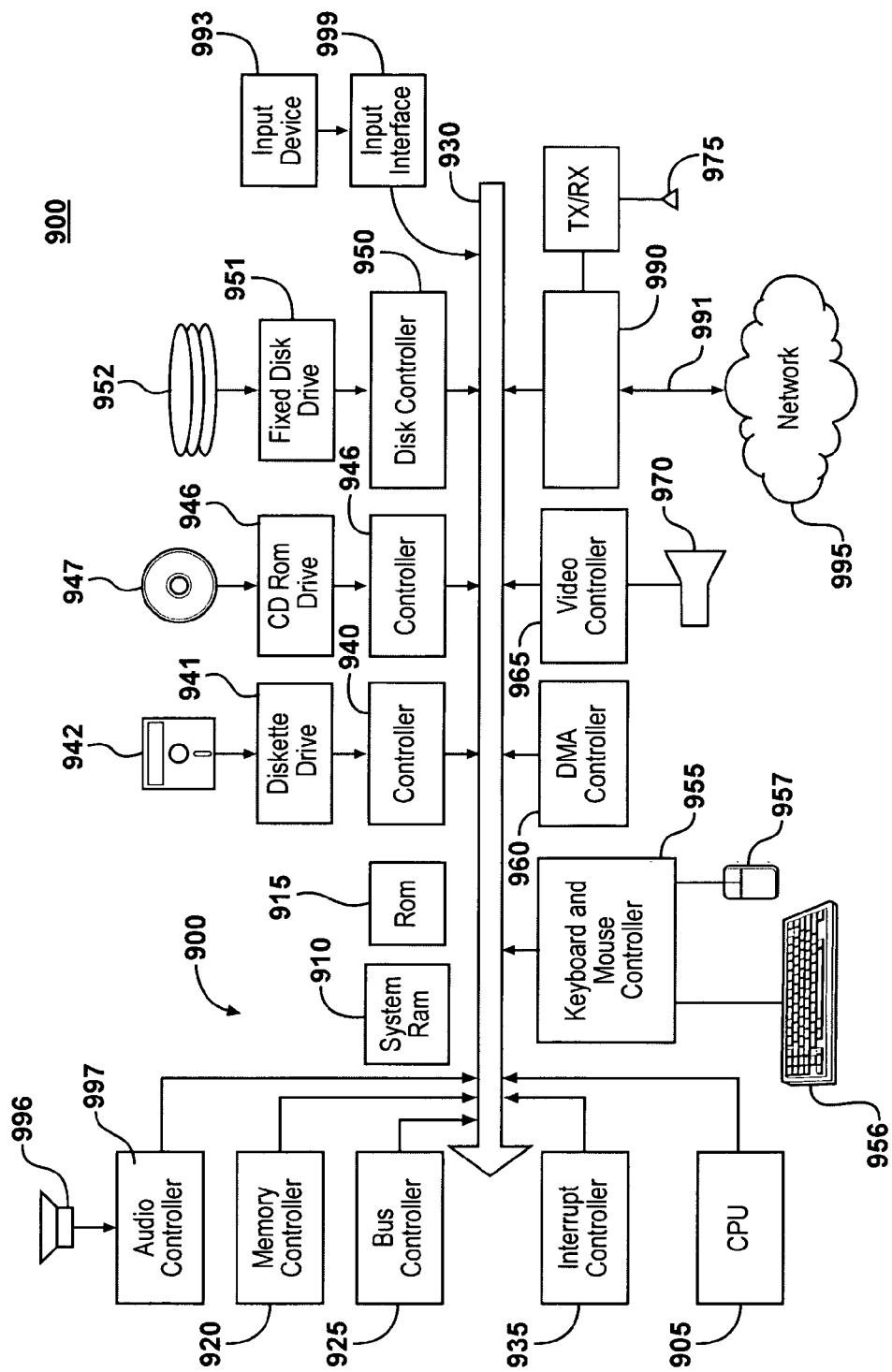

METHOD AND APPARATUS FOR ACCESSING A PHASE-CHANGE MEMORY

CROSS-REFERENCE TO RELATED APPLICATIONS

1 Field of Invention

This invention pertains to accessing phase change memories. More particularly, this invention relates to reading from and writing to a phase change memory device.

2 Background of the Invention

Phase-change memory arrays are based upon memory elements that switch among two material phases, or gradations thereof, to exhibit corresponding distinct electrical characteristics. Alloys of elements of group VI of the periodic table, such as Te, S or Se, referred to as chalcogenides or chalcogenic materials, can be used advantageously in phase change memory cells. In the chalcogenides, the resistivity varies by two or more orders of magnitude when the material passes from the amorphous (more resistive) phase to the crystalline (more conductive) phase, and vice versa. In the amorphous state, moreover, the resistivity depends on the temperature.

A chalcogenide memory device may utilize the wide range of resistance values available for the material as the basis of memory operation. Each resistance value corresponds to a distinct structural state of the chalcogenide material and one or more of the states can be selected and used to define operation memory states. Chalcogenide materials exhibit a crystalline state, or phase, as well as an amorphous state, or phase. Different structural states of a chalcogenide material differ with respect to the relative proportions of crystalline and amorphous phase in a given volume or region of chalcogenide material. The range of resistance values is generally bounded by a set state and a reset state of the chalcogenide material. By convention, the set state is a low resistance structural state whose electrical properties are primarily controlled by the crystalline portion of the chalcogenide material and the reset state is a high resistance structural state whose electrical properties are primarily controlled by the amorphous portion of the chalcogenide material.

Phase change may be induced by increasing the temperature locally. Below 150° C., both of the phases are stable. Above 200° C., there is a rapid nucleation of the crystallites and, if the material is kept at the crystallization temperature for a sufficiently long time, it undergoes a phase change and becomes crystalline. To bring the chalcogenide back to the amorphous state it is necessary to raise the temperature above the melting temperature (approximately 600° C.) and then cool it off rapidly, i.e. quench. From the electrical standpoint, it is possible to reach the crystallization and melting temperatures by causing a current to flow through a crystalline resistive element that heats the chalogenic material by the Joule effect.

Each memory state of a chalcogenide memory material corresponds to a distinct resistance value and each memory resistance value signifies unique informational content. Operationally, the chalcogenide material can be programmed into a particular memory state by providing an electric current pulse of an appropriate amplitude and duration to transform the chalcogenide material into the structural state having the desired resistance. By controlling the amount of energy provided to the chalcogenide material, it is possible to control the relative proportions of crystalline and amorphous phase regions within a volume of the material and to thereby control the structural (and corresponding memory) state of the chalcogenide material to store information.

Each memory state can be programmed by providing the current pulse characteristics of the state and each state can be identified, or "read", in a non-destructive fashion by measuring the resistance. Programming among the different states is fully reversible and the memory devices can be written and read over a virtually unlimited number of cycles to provide robust and reliable operation. The variable resistance memory functionality of chalcogenide materials is currently being exploited in the OUM (Ovonic Universal (or Unified) Memory) devices that are beginning to appear on the market. Basic principles and operation of OUM type devices are presented, for example, in U.S. Pat. Nos. 6,859,390; 6,774,387; 6,687,153; and 6,314,014; the disclosures of which are incorporated by reference herein, as well as in several journal articles including, "Low Field Amorphous State Resistance and Threshold Voltage Drift in Chalcogenide Materials," published in EE transactions on Electron Devices, vol. 51, p. 714-719 (2004) by Pirovana et al.; and "Morphing Memory," published in IEEE Spectrum, vol. 167, p. 363-364 (2005) by Weiss.

The behavior (including switching, memory, and accumulation) and chemical compositions of chalcogenide materials have been described, for example, in the following U.S. Pat. Nos. 6,671,710; 6,714,954; 6,087,674; 5,166,758; 5,296,716; 5,536,947; 5,596,522; 5,825,046; 5,687,112; 5,912,839; and 3,530,441, the disclosures of which are hereby incorporated by reference. These references present proposed mechanisms that govern the behavior of chalcogenide materials. The references also describe the structural transformations from the crystalline state to the amorphous state (and vice versa) via a series of partially crystalline states in which the relative proportions of crystalline and amorphous regions vary during the operation of electrical and optical programming of chalcogenide materials.

A wide range of chalcogenide compositions has been investigated in an effort to optimize the performance characteristics of chalcogenic devices. Chalcogenide materials generally include a chalcogen element and one or more chemical or structural modifying elements. The chalcogen element (e.g. Te, Se, S) is selected from column VI of the periodic table and the modifying elements may be selected, for example, from column III (e.g. Ga, Al, In), column IV (e.g. Si, Ge, Sn), or column V (e.g. P, As, Sb) of the periodic table. The role of modifying elements includes providing points of branching or cross-linking between chains comprising the chalcogen element. Column IV modifiers can function as tetracoordinate modifiers that include two coordinate positions within a chalcogenide chain and two coordinate positions that permit branching or crosslinking away from the chalcogenide chain. Column III and V modifiers can function as tricoordinate modifiers that include two coordinate positions within a chalcogenide chain and one coordinate position that permits branching or crosslinking away from the chalcogenide chain. Embodiments in accordance with the principles of the present invention may include binary, ternary, quaternary, and higher order chalcogenide alloys. Examples of chalcogenide materials are described in U.S. Pat. Nos. 5,166,758, 5,296,716, 5,414,271, 5,359,205, 5,341,328, 5,536,947, 5,534,712, 5,687,112, and 5,825,046 the disclosures of which are all incorporated by reference herein. Chalcogenide materials may also be the resultant of a reactive sputtering process with gasses such as N2 or O2: forming a chalcogenide nitride, or oxide, for example and chalcogenide may be modified by an ion implantation or other process.

Early work in chalcogenide devices demonstrated electrical switching behavior in which switching from an "off" resistive state to an "on" conductive state was induced upon application of a voltage at or above the threshold voltage of the active chalcogenide material. This effect is the basis of the Ovonic Threshold Switch (OTS) and remains an important practical feature of chalcogenide materials. The OTS provides highly reproducible switching at ultrafast switching speeds. Basic principles and operational features of the OTS are presented, for example, in U.S. Pat. Nos. 3,271,591; 5,543,737; 5,694,146; and 5,757,446; the disclosures of which are hereby incorporated by reference, as well as in several journal articles including "Reversible Electrical Switching Phenomena in Disordered Structures," Physical Review Letters, vol. 21, p. 1450-1453 (1969) by S. R. Ovshinsky; "Amorphous Semiconductors for Switching, Memory, and Imaging Applications," IEEE Transactions on Electron Devices, vol. ED-20, p. 91-105 (1973) by S. R. Ovshinsky and H. Fritzsche; the disclosures of which are hereby incorporated by reference. Three-terminal OTS devices are disclosed, for example, in U.S. Pat. Nos. 6,969,867 and 6,967,344; the disclosures of which are hereby incorporated by reference.

Although an individual OUM device typically exhibits a resistance variation of at least two orders of magnitude between its SET and RESET states, those resistance values may vary, over time, with environmental factors (e.g. temperature), and from individual device to device. Such variations may diminish the reliability of OUM devices, particularly multi-level OUM devices that require read and write margins for each of a plurality of storage levels. A system and method that reduce the variability of programmed levels within OUM devices would therefore be highly desirable.

SUMMARY OF THE INVENTION

A system and method in accordance with the principles of the present invention employs fixed-voltage programming pulses to program a phase change memory cell. In an illustrative embodiment such a system and method SETs phase change memory cells in a conventional manner using, for example, a SET sweep pulse. All other logic levels may be programmed using fixed-voltage pulses, the amplitude of which equals a target threshold voltage of the cell.

Such a system and method may be used to program phase change memory cells for binary or multi-level storage. By convention, in a binary configuration the cell may be programmed to either a SET state or a RESET state, respectively corresponding to the lowest and highest impedance values offered by the phase change memory cell. Although intermediate states (i.e. more or less "RESET") could be employed as the two binary values, using the highest and lowest impedance provides the greatest error margin for reading and writing the devices.

Not only does a cell's impedance vary according to the level to which it is RESET, the cell's threshold voltage varies too, in substantially the same manner. That is, once the device begins the transition from the SET state to the RESET state, the device's threshold voltage increases at a rate corresponding to the device's increase in impedance. A system and method in accordance with the principles of the present invention employs the threshold voltage of a phase change memory cell as a programming parameter. That is, a method and apparatus in accordance with the principles of the present invention programs a phase change memory cell to exhibit a target threshold voltage. In a multi-level memory embodiment, multiple threshold voltages, corresponding to multiple memory states, may be specified and programmed. A burst of variable-width pulses having a voltage amplitude equal to the target threshold value are employed to program the phase change memory cell to a desired threshold voltage level. In an illustrative embodiment, each successive pulse within a programming burst is wider (that is, of longer duration) than the previous. Each successive pulse within a programming burst is configured to increment the threshold voltage of the phase change memory cell until the threshold voltage of the cell equals the amplitude of the pulses within the programming burst. Once the phase change memory cell's threshold voltage is slightly greater than the voltage of the programming pulses, subsequent pulses will be unable to trigger the cell and, consequently, will be unable to program the cell any further, thus clamping the threshold voltage of the cell at very near the amplitude of the series of programming pulses.

BRIEF DESCRIPTION OF THE DRAWINGS

FIG. 3 is a conceptual block diagram of phase change memory access circuit in accordance with the principles of the present invention;

FIGS. 4A through 4D are graphical representations of the process of programming a phase change memory cell in accordance with the principles of the present invention;

FIG. 5 is a graphical representation of logic levels associated with a phase change memory in accordance with the principles of the present invention;

FIG. 6 is a graphical representation of fixed-voltage programming pulses such as may be employed in accordance with the principles of the present invention;

FIG. 9 is a conceptual block diagram of an electronic device that employs a phase change memory in accordance with the principles of the present invention.

DETAILED DESCRIPTION

Although this invention will be described in terms of certain preferred embodiments, other embodiments that are apparent to those of ordinary skill in the art, including embodiments that do not provide all of the benefits and features set forth herein, are also within the scope of this invention. Various structural, logical, process step, chemical, and electrical changes may be made without departing from the spirit or scope of the invention. Binary memory cell operation is a special case of multi-level operation. For the sake of clarity and brevity of description, the following discussion will be generally in terms of a multi-level implementation, but binary implementations are also within the scope of the invention. Accordingly, the scope of the invention is defined only by reference to the appended claims.

Figure 1:
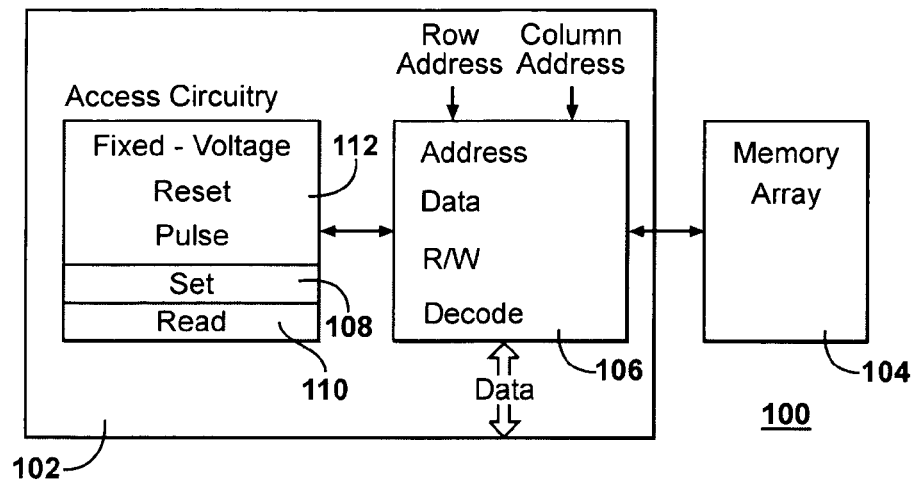
FIG. 1 is a conceptual block diagram of phase change memory access circuitry in accordance with the principles of the present invention.

As illustrated in the conceptual block diagram of FIG. 1, a system 100 in accordance with the principles of the present invention employs fixed-voltage programming pulses to program a phase change memory cell. In the illustrative embodiment of FIG. 1 the system 100 includes memory access circuitry 102 configured to write data to and read data from a phase-change memory array 104. Phase change memory arrays are known and may be organized, for example, as hierarchical memories. The memory array 104 may include phase change memory cells arranged in a two dimensional matrix, with row (also referred to as wordline) and column (also referred to as bitline) decoder and driver transistor devices and row and column interconnect conductors, for example. Phase change memory arrays are known and discussed, for example, in U.S. Pat. No. 6,813,177 issued to Lowrey et al, which is hereby incorporated by reference.

The access circuitry 102 includes address, data, and read/write decode circuitry that determines, in response to input from circuitry accessing the memory, what operation (i.e. READ, SET, RESET) will be performed upon what cell within the memory 104 and, if a multi-level RESET operation is to be performed, what data is to be written into the phase change cell. In embedded memory applications within the scope of the invention, the memory array 104 and access circuitry 102 may be formed on the same die, adjacent other circuitry, such as a microprocessor, for example.

In this illustrative embodiment of a phase-change memory in accordance with the principles of the present invention, the access circuitry 102 includes SET pulse circuitry 108, READ circuitry 110, and RESET pulse circuitry 112. The SET pulse circuitry 108 is configured to provide a pulse (or pulses) that will SET an addressed phase change cell within the memory array 104. READ circuitry 110 includes circuitry, such as sense amplifiers, for example, that allows the READ circuitry to assess the logic state of an addressed memory cell within the memory array 104. The RESET circuitry is configured to provide a fixed-voltage burst of programming pulses for supply to an addressed memory cell within the memory array 104 and to thereby RESET the memory cell to a level corresponding to the fixed-voltage of the pulses within the RESET burst.

In operation, a series resistance between the programming pulse source and the memory cell is configured to allow the programming voltage pulses to supply sufficient current to the cell to program the cell. That is, the series resistance is configured so that the minimum target threshold voltage Vtarmin supplies enough current, Vtarmin/Rseries, to program a phase change memory cell. The series resistance may include the line resistance of an array's interconnect (e.g. the column line resistance between the programming pulse source and a memory cell to be programmed) and the contact resistance of the memory cell, for example.

Figure 2A:
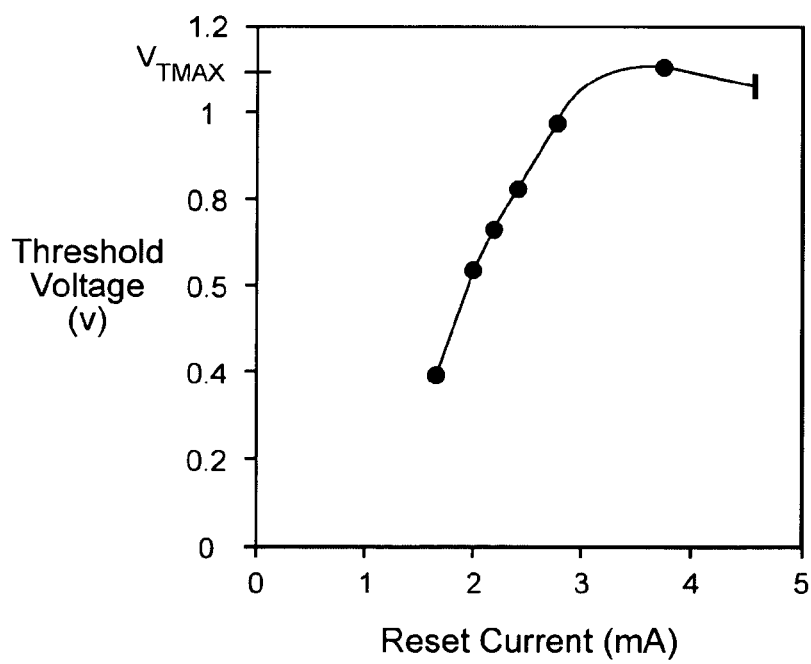
FIGS. 2A through 2C are, respectively, graphs of threshold voltage versus current, reset current versus voltage, and resistance versus programming current for phase change memory cells such as may be included in a memory in accordance with the principles of the present invention.
Figure 2B:
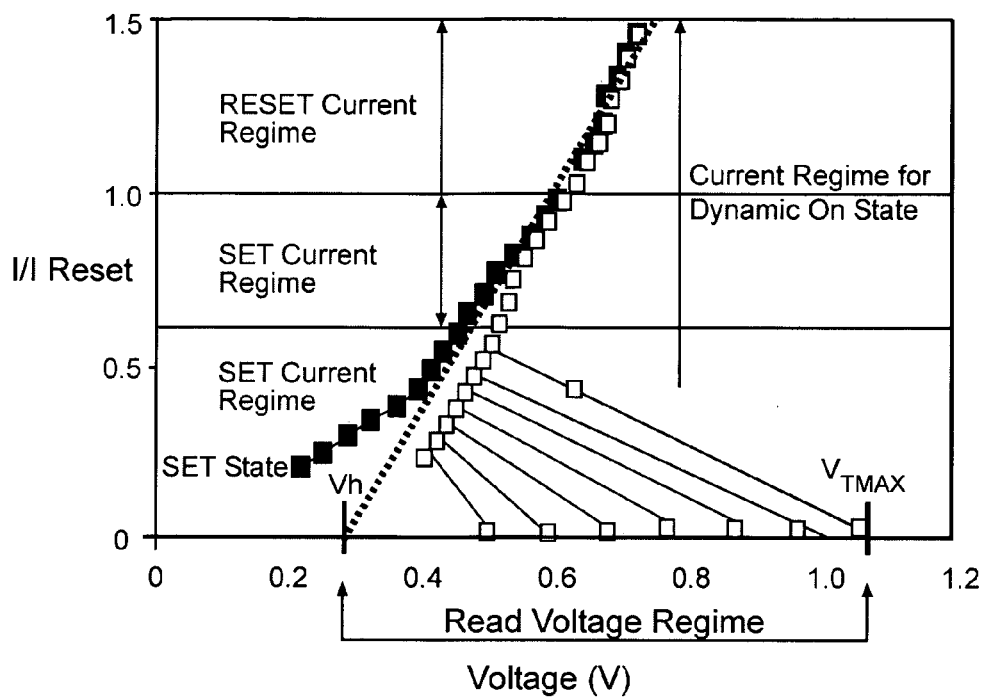
Figure 2C:
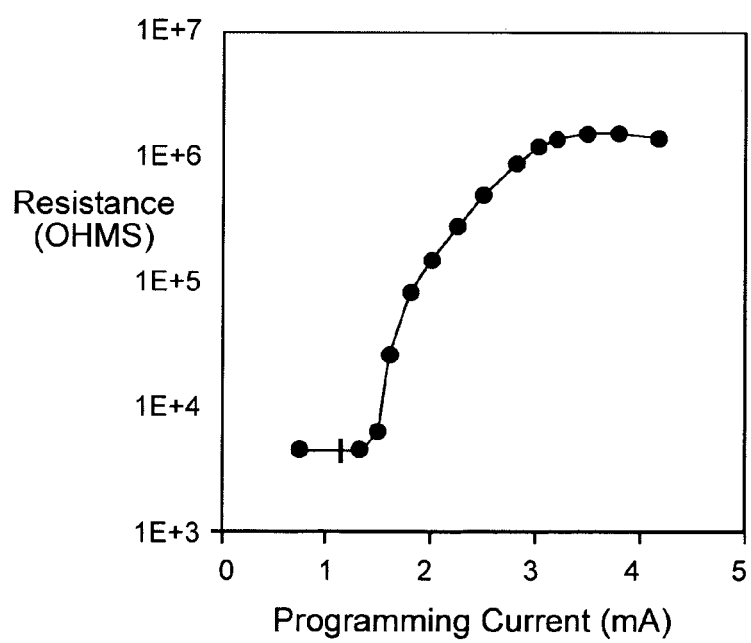

The graphs of FIGS. 2A, 2B, and 2C respectively illustrate the threshold-voltage/current, RESET-current/voltage, and resistance/current relationships of a phase change memory in accordance with the principles of the present invention. In an illustrative embodiment, such a phase change memory may be programmed to multiple data levels corresponding to threshold voltages L1 . . . , Ln of FIG. 2A (with n=2 corresponding to binary operation). The data levels L1 . . . , Ln of FIG. 2A also correspond to similarly marked threshold voltages of FIG. 2B. Each threshold voltage level L2 . . . , Ln represents a different degree of "RESETedness." That is, in the transition from a fully SET cell to a fully RESET cell, not only does the resistance of the device increase, as illustrated in the resistance/programming-current graph of FIG. 2C, the threshold voltage increases until it reaches an upper bound, as indicated by points labeled $V_{THMAX}$ in the graphs of FIGS. 2A and 2B.

The traces of FIG. 2B illustrate the characteristics of a phase change memory cell, with different traces representative of everything from a SET condition (trace labeled SET), through the low-level partial-RESET traces (corresponding to threshold levels L1 . . . , Ln), to the fully RESET trace labeled, simply, Vth. The reset traces illustrate an S type negative differential conductivity that is a switching or snap-back to a conducting "ON" state. It is this phenomenon that allows both reading the phase change device without disturbing the contents (for applied voltage less than the threshold voltage, i.e. "Read Voltage Regime") and programming with a current after the switching event at a nominal voltage.

Once in the dynamic on state, programming occurs by heat generated in the active region of the phase change memory. The heating causes the material to either crystallize (requiring both time and temperature) or amorphize (requiring temperatures above the melting point accompanied by rapid quenching to freeze the material in the amorphous state). Extrapolating the I-V characteristics of the dynamic state to the X-axis yields the holding voltage Vh. Vh is the voltage dropped across the bulk of a cell's active region during programming. In accordance with the principles of the present invention, fixed-voltage pulse-bursts program the threshold voltage of a phase change cell to any target voltage between Vh and $V_{THMAX}$. Resetting a cell, which includes, programming a cell to any threshold voltage within the range $V_{THMIN}$ to $V_{THMAX}$, employs currents in the range labeled "reset current regime."

The block diagram of FIG. 3 provides a conceptual view of a programming pulse circuit 300 in accordance with the principles of the present invention. At the top level, the circuit 300 includes a single voltage burst generator (for binary phase change operation), but, more generally, the circuit 300 will include a plurality of voltage burst generators 302, each of which supplies bursts of fixed-voltage programming pulses. Each fixed voltage level corresponds to a target threshold voltage value. That is, when programming a phase change cell to a threshold voltage VTH having a value V1, a system and method in accordance with the principles of the present invention employs bursts of programming pulses, all of the same magnitude V1. As will be described in the discussion to follow, the pulses within a burst increase in duration from first to last and thereby increment the threshold voltage of the phase change cell until the cell reaches the target level. If the cell is transformed to the target VTH level before the end of a burst, subsequent, longer pulses within the burst will program the cell no further. That is, although subsequent pulses will be increasingly wider and, therefore, could conceivably program the cell to a higher level, subsequent pulses will not be of sufficient amplitude to trigger the cell and, therefore, will be unable to program the cell any further. This approach to programming a cell ensures that every cell within an array may be programmed with precision to threshold voltages that uniformly represent the same logic levels throughout an array. A given logic level will be precisely represented by the same threshold voltage throughout the phase change memory array.

In this illustrative conceptual block diagram a selector 304 selects among the available fixed voltage bursts provided by the generators 302. The selector 304 may, for example, operate under control of address and data decode logic described in the discussion related to FIG. 1. More particularly, a data decoder such as described in the discussion related to FIG. 1 may be employed to control the selector 304. For example, if a phase change memory were configured to store two bits of data within each cell, the memory may be programmable to three different RESET levels in addition to a SET level. Although typically described in terms of resistance levels, in accordance with the principles of the present invention the logic levels correspond to three VTH (RESET) levels and a Vth=0 (SET) level, corresponding to the voltages at which the cell is triggered (in the case of the three RESET levels). In such an embodiment, the generators 302 would provide bursts of three different voltage levels and the data to be written (0, 1, 2, 3 or 00, 01, 10, 11) would control the selector 304 to route a burst of the appropriate voltage from the generator 302 to the memory cell being programmed.

The conceptual diagrams of FIGS. 4A through 4D illustrate the process of programming a cell to a target threshold voltage in accordance with the principles of the present invention. Programmed threshold voltages are depicted as horizontal lines. Programming pulses are depicted as vertical bars. Time increases from left to right.

In the illustrative embodiment of FIG. 4A, the initial threshold voltage of the cell is V1. A burst of programming pulses having an amplitude Vtar1 equal to the target threshold voltage includes pulses P1 through Pn. The duration of each pulse within the burst increases from the first pulse within the burst, of minimal duration Tmin, to the last pulse within the burst, of maximum duration Tmax. In this illustrative embodiment the pulses within the burst are of greater amplitude than the initial threshold voltage V1 of the cell being programmed. Consequently, the pulse P1 triggers the cell and, with proper limits on the current available from the pulse generator, the cell is brought to the RESET current regime as described in the discussion related to FIG. 2B. In this illustrative embodiment the pulse P1 delivered sufficient power to increase the threshold voltage of the cell to a level V2.

The second pulse with the burst P2, having an amplitude, as all pulses within the burst do, of Vtar1 that is greater than the newly programmed threshold voltage V2 will also trigger the cell. Because pulse P2 is of greater duration than pulse P1 it will supply more power to the cell than pulse P1 and, consequently, program it to a higher threshold voltage.

In this illustrative embodiment, pulse P2 programs the cell to a voltage V3 that is slightly higher than the target threshold voltage Vtar1. Subsequent pulses within the burst, P3 . . . Pn, being of an amplitude Vtar1 that is less than the newly programmed threshold voltage V3 will not trigger the cell and, consequently, the cell's threshold voltage will remain at V3, substantially equal to the target voltage Vtar. The threshold voltages V1 and V3 may be used to represent discrete logic levels in a multi-level phase change memory in accordance with the principles of the present invention. An embodiment in accordance with the principles of the present invention is configured to supply sufficient current, even at the minimal level (supplied at the lowest threshold voltage/logic level), to program the cell. Similarly, in the illustrative embodiment of FIG. 4B, the cell initially exhibits the threshold voltage V3 and the pulses within a second programming burst have a second target amplitude Vtar2. As within the burst described in the discussion related to FIG. 4A the pulses P1, . . . Pn within this burst are of equal amplitude Vtar2 and increase in duration from a minimum duration Tmin to a maximum duration Tmax.

The durations Tmin and Tmax need not correspond to the durations Tmin and Tmax of FIG. 4A. That is, the respective durations of pulses within a programming burst for one target threshold voltage need not equal those of a programming burst for a different target threshold. In this illustrative embodiment, the first pulse P4 within this burst has a voltage amplitude that is sufficient to trigger the cell and enough power (duration) to lift the threshold voltage of the cell to a voltage V4.

The second pulse with the burst P5, having an amplitude, as all pulses within the burst do, of Vtar2 that is greater than the newly programmed threshold voltage V4 will also trigger the cell. Because pulse P5 is of greater duration than pulse P4 it will supply more power to the cell than pulse P4 and, consequently, program it to a higher threshold voltage. In this illustrative embodiment, pulse P5 programs the cell to a voltage V5 that is slightly less than the target threshold voltage Vtar2.

Pulse P6 has sufficient duration (and, correspondingly, power) to program the cell to a level V6 that is slightly higher than the target threshold voltage Vtar2. Subsequent pulses within the burst, P6 . . . Pn, being of an amplitude Vtar2 that is less than the newly programmed threshold voltage V6 will not trigger the cell and, consequently, the cell's threshold voltage will remain at V6, substantially equal to the target voltage Vtar2. The threshold voltage V6 may be used along with a SET level, and voltages V1 and V3 to represent discrete logic levels in a multi-level phase change memory in accordance with the principles of the present invention.

In the illustrative embodiment of FIG. 4C, the cell initially exhibits the threshold voltage V6 and the pulses within a third programming burst have a third target amplitude Vtar3. As within the bursts described in the discussion related to FIGS. 4A and 4B, the pulses P1, . . . Pn3 within this burst are of equal amplitude Vtar3 and increase in duration from a minimum duration Tmin to a maximum duration Tmax.

In this illustrative embodiment the target threshold voltage Vtar3 is less than the existing threshold voltage of the cell V6. Because, as is evident from the forgoing discussion, a method in accordance with the principles of the present invention incrementally increases the threshold voltage of a cell until it reaches a target value, a slightly different approach must be taken when programming a cell from a higher to a lower threshold voltage. In this illustrative embodiment a SET pulse is applied to the cell prior to the application of a programming burst. As is known in the art, a SET pulse generally heats a cell's phase change material without melting it and holds the material at that temperature for a sufficient period of time to permit nucleation and growth of crystallites within the phase change material, thereby promoting the crystallization, or SETTING, of the material. The threshold voltage of a memory cell in the set state is effectively 0 V. Once SET, the pulses P7, P8, P9, . . . Pn3 operate in the same fashion as described in the discussion related to FIGS. 4A and 4B.

In an illustrative embodiment in accordance with the principles of the present invention, a multi-level logic embodiment of a phase change memory in accordance with the principles of the present invention precedes every threshold voltage RESET burst with a SET pulse in order to ensure that the RESET pulse burst program the threshold voltage of the cell to a desired level. In another illustrative embodiment, a cell is read before writing to it. The threshold voltage of the cell is then compared to the target threshold voltage, and a SET pulse precedes the RESET pulse burst only if the existing threshold value of the cell exceeds the target threshold value for the cell.

Turning now to FIG. 4D, the cell initially exhibits the threshold voltage V7 and the pulses within a second programming burst have a target amplitude Vtar4. As within the burst described in the discussion related to FIGS. 4A, 4B and 4C, the pulses P9, P10, P11, . . . Pn4 within this burst are of equal amplitude Vtar4 and increase in duration from a minimum duration Tmin4 to a maximum duration Tmax4. Again, the durations Tmin4 and Tmax4 need not correspond to the durations Tmin and Tmax of FIG. 4A, 4B, or 4C.

In this illustrative embodiment, the first pulse within this burst P9 has a voltage amplitude sufficient to trigger the cell and enough power to raise the threshold voltage of the cell to a voltage V6. The second pulse within the burst P10, having an amplitude Vtar4 that is greater than the newly programmed threshold voltage V8 will also trigger the cell. Because pulse P10 is of greater duration than pulse P9 it will supply more power to the cell than pulse P9 and, consequently, program it to a higher threshold voltage. In this illustrative embodiment, pulse P10 programs the cell to a voltage V10 that is substantially greater than the target threshold voltage Vtar4. Subsequent pulses, such as pulse P11 will program the cell no further because, as previously discussed, the amplitude of the pulse P11 is lower than the newly programmed threshold voltage V10. Depending upon the number of logic levels and the error margin available at each level, "over-programming" such as effected by pulse P10 could have deleterious consequences.

The potential for harm due to a pulse of too great duration may be better understood by referring to the conceptual multi-level logic diagram of FIG. 5. In this illustrative embodiment a phase change memory in accordance with the principles of the present invention employs three logic levels: level 1, level 2, and level 3. In accordance with the principles of the present invention, these levels may be reflected in the resistance of a phase change memory or, correspondingly, the threshold voltage of such a memory. As previously described, in accordance with the principles of the present invention, the data storage parameter, however, is a memory cell's threshold voltage. In order to distinguish one logic level from another, nominal logic levels are separated by a "distance" (e.g. voltage or resistance) labeled LEVEL. Each level may have associated with it an "error" bar DELTA above or below the assigned logic value.

A logic level separation, LEVEL, then, may be divided into three segments, two delta values (one from the top and one from the bottom logic level) and a margin, MARGIN, which is conceptually, a "forbidden zone" to reliably ensure that one logic level is not mistaken for another.

The separation among logic levels need not be linear. That is, it may be convenient for writing and reading memory cells in accordance with the principles of the present invention to assign wider margins to one or more logic levels than to one or more other logic levels. The danger of "over-programming" (as illustrated with pulse P10 of FIG. 4D), is that a cell may be inadvertently driven into the MARGIN region, rendering the cell's logic level ambiguous.

The danger of over-programming may be mitigated by using sufficiently small enough increments while increasing duration of pulses within a programming pulse burst. In accordance with the principles of the present invention, the increase in pulse-width within a programming pulse burst may be regulated as will be described in the discussion related to FIG. 6. Each successive pulse within a burst increases in duration. In this illustrative embodiment pulses P1, P2, and P3 have respective pulse widths PW1, PW2, and PW3. The delay between pulses (DELAY1 and DELAY2 in this illustrative embodiment) needn't be equal. In this illustrative embodiment, the duration of each pulse is incremented by an amount INCR.

In accordance with the principles of the present invention, the width of the pulse PW1 may be selected based on a number of factors. Because it is the first pulse in the burst, it is the narrowest pulse in the burst and, consequently, delivers the least power to a memory cell being programmed. In accordance with the principles of the present invention, in order to minimize the number of programming pulses within a burst, the width of this narrowest pulse may be chosen to deliver enough power to program the most readily programmed cell in a memory array to the lowest, non-SET, logic level used in the memory's multi-level logic scheme.

In accordance with the principles of the present invention, environmental factors are taken into consideration in this selection as well. That is, because ambient operating temperatures may have an effect on how readily a cell is programmed, the selection of a narrowest pulse width should accommodate such variation. On the one hand, the narrowest pulse should not provide so much power as to program the most readily programmed cell to a level greater than the lowest level threshold voltage plus the DELTA voltage described in the discussion related to FIG. 5. On the other hand, it would be desirable to minimize the number of pulses within a programming burst. To that end, reducing the number of, or eliminating altogether, narrow pulses that don't program even the most readily programmed memory cell would serve to reduce the number of pulses within a burst while maintaining the desired functionality. That is not to say that some minimal number of narrow pulses may not be used to ensure that the most readily programmed cell isn't "over-RESET."

Similarly, in an illustrative embodiment in accordance with the principles of the present invention, the widest pulse may be tailored to "just" program the least programmable of all cells within the memory array to the target threshold voltage of the burst. Again, although it may be desirable to minimize the number of programming pulses in a burst, a minimal number of additional, wider, pulses may be included within a burst to ensure that, over the operational temperature range and across the variable programmability of cells within the array, every operational cell within the array may be programmed to each target threshold voltage employed in the multi-level logic scheme.

In the illustrative embodiment of FIG. 6, each successive pulse in a programming pulse burst is incremented in duration by an amount INCR. As previously mentioned, this increment in pulse-width corresponds to an increase in power delivered to a phase change memory cell. In accordance with the principles of the present invention, this increment may be chosen to contain no more power than that required to raise the threshold voltage of a memory cell by the amount DELTA described in the discussion related to FIG. 5. By limiting the incremental power INCR in this manner, a system and method in accordance with the principles of the present invention avoids the over-programming described in the discussion related to FIG. 4D.

In an illustrative embodiment, the appropriate duration of the incremental value INCR may be determined empirically or an approximate value may be obtained, for example, by modeling the phase change material, determining the power required to raise the threshold voltage of the most easily programmed cell in the array by an amount DELTA, and correlating that power figure with the pulse-width increment INCR. That is, the degree to which a phase change cell is programmed and, consequently, the threshold voltage and, correspondingly, the resistance it exhibits, is dependent upon the applied power. The applied power may be expressed in terms of the width of the current pulse. The relationship between pulse-width and RESET current, and, by extension, threshold voltage, is described, for example, in a paper presented, entitled "CHARACTERISTICS OF OUM PHASE CHANGE MATERIALS AND DEVICES FOR HIGH DENSITY NONVOLATILE COMMODITY AND EMBEDDED MEMORY APPLICATIONS," by Tyler A. Lowrey, Stephen J. Hudgens, Wally Czubatyj, Charles H. Dennison, Sergey A. Kostylev, and Guy C. Wicker, presented at the Fall 2003 meeting of the Materials Research Society, Dec. 2, 2003, which is hereby incorporated by reference.

Briefly, by approximating the geometry of a phase change memory cell as a sphere and assuming uniform heating within the programmed volume of the phase change material, one can solve the heat flow equation analytically and this provides a good approximation of both the time dependence and contact area dependence of current required to program a phase-change cell. The temperature distribution at time, T, and radius, r, during application of constant source power, P, can be determined by integrating the heat flow equation for a spherical source solution over time from zero to t:

$$T(r,t) = P\,erfc(r/\delta)/4\pi\alpha C_v r$$

$$\delta^2 = 4\pi\alpha t$$

$$\alpha = \kappa/C_v$$

Where P is the applied power, r is the distance from the source of power, $\alpha$ is the insulator thermal diffusivity, $C_v$ is the insulator specific heat capacity (per unit volume), K is the insulator thermal conductivity, and $T_m$ is the melting temperature of the phase change material. For P=Vh*Ireset $$Ireset = 4\pi r \kappa T_m V_h / erfc(r/\delta)$$

The above analysis may be used to determine the appropriate value of pulse-width increment INCR.

In an illustrative embodiment in accordance with the principles of the present invention, the appropriate number of pulses within a programming burst may be determined from the width of the narrowest programming pulse (e.g. the narrowest pulse that will program the most readily programmed cell in a memory array) and the value of the incremental increase in pulse-width INCR. Assuming that equal increments in pulse width are used for each successive pulse, in an illustrative embodiment the number of pulses in a burst is simply the difference between the narrowest and widest pulses (both discussed above) divided by the increment INCR. As previously described, additional pulses may be included within a burst to provide additional operating margin.

The time between pulses, DELAY1 and DELAY2 in this illustrative embodiment needn't be equal but, in order to avoid continuous programming of a memory cell, the time between pulses is sufficient to allow the cell to quench (i.e. return to a temperature below the crystallization temperature) before a subsequent pulse reaches the cell.

Figure 7:
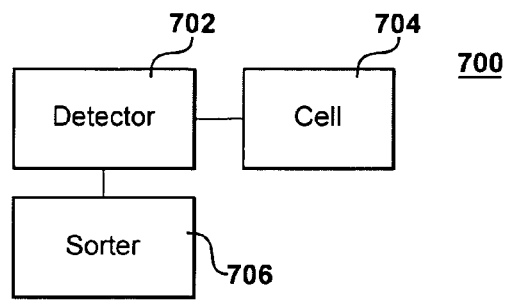
FIG. 7 is a conceptual block diagram of a threshold voltage read system in accordance with the principles of the present invention.

The conceptual block diagram of FIG. 7 illustrates the basic components of a phase-change memory read scheme 700 in accordance with the principles of the present invention. A threshold voltage detector 702 non-disruptively accesses a target phase change memory cell 704 and determines the threshold voltage of the cell. In an illustrative embodiment described in greater detail in the discussion related to FIG. 8, the detector 702 employs a peak detector to determine the threshold voltage of the cell 704. A sorter 706 assigns a storage level value to the memory cell 704, based on the cell's threshold voltage. Such an assignment may reflect the margin described in the discussion related to FIG. 5, for example. That is, a range of threshold voltages above and below a nominal value may be assigned to the storage level corresponding to the nominal threshold value.

Figure 8A:
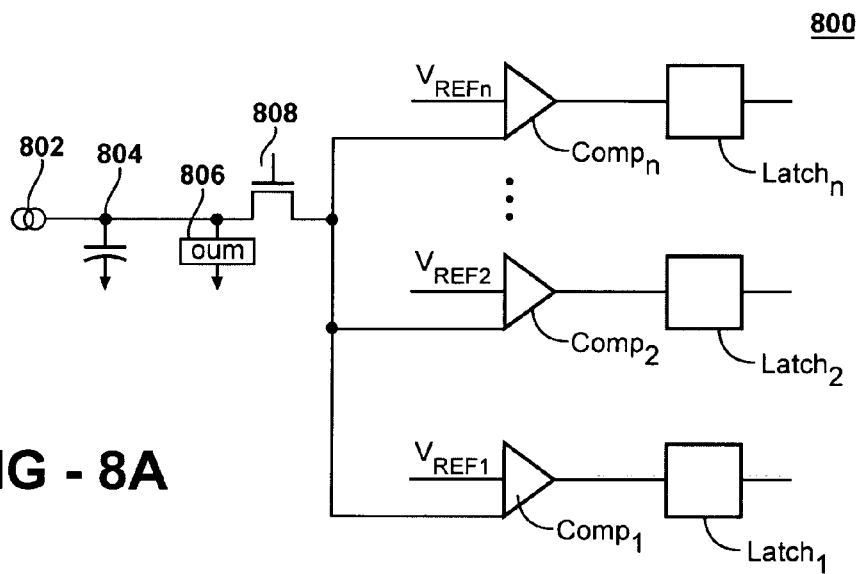
FIGS. 8A and 8B are, respectively, a schematic diagram of an illustrative threshold voltage read system and associated voltage profile in accordance with the principles of the present invention.

The schematic diagram of FIG. 8A provides an illustrative embodiment of a threshold-voltage read system 800 in accordance with the principles of the present invention. A "READ" current source 802 provides current to charge a capacitor 804. The capacitor 804 may be, for example, the capacitance associated with a row or column line within a memory array, such as array 104 of FIG. 1. A phase change memory cell 806 is connected in parallel with the capacitor 804. For the convenience and clarity of exposition, the capacitor 804 and phase change memory cell 806 are shown connected to ground in this illustrative embodiment. As is known in the art, the capacitor 804 and phase change memory cell 806 may be connected through a switching device to ground (or to another potential), with the switching device under control of a row or column access signal.

In this illustrative embodiment, one or more comparators COMP1, COMP2, . . . COMPn are configured to compare the voltage across the phase change memory cell 806 to respective reference voltages VREF1, VREF2, . . . VREFn. The outputs of comparators COMP1, COMP2, . . . COMPn are latched with respective latches LATCH1, LATCH2, . . . LATCHn. As will be described in greater detail below, in this illustrative embodiment, the latched outputs provide an indication of the threshold voltage of the memory cell 806. The latches may be reset, for example, at the beginning of a read operation. A switch 808 provides a low-impedance path between the phase change memory cell 806 and the comparators COMP1, COMP2, . . . COMPn. The switch 808 may be implemented, for example, as an n-channel MOSFET, and may be operated under control of the decode logic 106 described in the discussion related to FIG. 1. The threshold voltage read system 800 may service a plurality of phase change memory cells such as memory cell 806. For example, a single threshold voltage read system 800 may be dedicated to a block of memory within a hierarchical memory array or to an entire memory array.

Figure 8B:
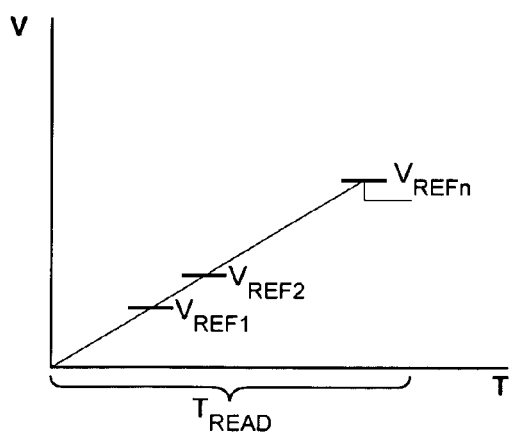

In operation, the read current source 802 charges the capacitor 804 at a steady rate, producing an increasing ramp voltage such as illustrated in the graphical representation of FIG. 8B. The steadily increasing voltage is also imposed across the phase change memory cell 806. As illustrated, the "read voltage" passes through the reference voltage levels VREF1, VREF2, and VREFn until it reaches the threshold voltage to which the memory cell 806 has been programmed. When the read voltage ramp reaches the threshold voltage of the memory cell 806, the cell becomes highly conductive and the voltage across the memory cell 806 drops. In this illustrative embodiment, the phase change memory cell 806 has been programmed to a threshold voltage of VREFn and when the read ramp voltage reaches that level, the phase change memory switches to its conducting state. With the phase change memory conducting, the ramp voltage drops, as indicated in the graph of FIG. 8B. In order to avoid over-writing the memory cell contents, the current through the cell is limited to a value less than a disturb current value (that is, less than the amount required to SET or RESET the memory cell). On the other hand, the READ current through the memory cell 806 meets or exceeds the memory cell's threshold current level.

At the end of a read period, the highest latched comparator output provides an indication of the threshold voltage of the phase change memory cell. For example, the reference voltages VREF1, VREF2, . . . VREFn may be chosen to be equal to the nominal threshold voltages employed by a multilevel phase change memory storage system in accordance with the principles of the present invention. With the read period Tread selected to be long enough to allow the voltage across the phase change memory cell 806 to ramp up to a value corresponding to the highest storage level, the latched comparator value indicates the voltage at which the phase change memory cell began conducting at a high level (that is, the threshold voltage of the cell 806).

The latched highest voltage value, the peak voltage across the phase change memory cell 806, may be correlated with the multi-level phase change memory's storage levels. For example, with each reference voltage selected to correspond directly with a different threshold voltage value, the lowest peak voltage would correspond to the lowest storage level, the second lowest peak voltage would correspond to the second lowest storage level, and so on.

In order to accommodate threshold voltage variation among an array of memory cells, a plurality of voltage references and comparators may be employed at each nominal storage level. That is, for example, a lower reference voltage may be employed to detect the threshold voltages at the lower bound of a nominal storage level. This lower bound may be, for example, the nominal level minus a DELTA as described in the discussion related to FIG. 5. Similarly, an upper bound for each storage level may be set equal to the nominal level plus a DELTA such as described in the discussion related to FIG. 5. If the upper bound of a storage level is set so that a voltage exceeding it falls into the MARGIN area described in the discussion related to FIG. 5, the sorter 706 may flag an error. That is, if the upper bound of one nominal storage level is exceeded, but the lower bound of the next logic level is not, the threshold voltage of the memory cell would appear to lie within the MARGIN area, an ambiguous state.

The phase change electronic device(s) described in the discussion related to the previous figures may be employed to particular advantage in a wide variety of systems. The schematic diagram of FIG. 9 will be discussed to illustrate the devices' use in a few such systems. The schematic diagram of FIG. 9 includes many components and devices, some of which may be used for specific embodiments of a system in accordance with the principles of the present invention and while others not used. In other embodiments, other similar systems, components and devices may be employed. In general, the system includes logic circuitry configured to operate along with phase change memory. The logic circuitry may be discrete, programmable, application-specific, or in the form of a microprocessor, microcontroller, or digital signal processor, for example. And the embodiments herein may also be employed within the chips or connected to such circuitry. The exemplary system of FIG. 9 is for descriptive purposes only. Although the description may refer to terms commonly used in describing particular computer, communications, tracking, and entertainment systems, the description and concepts equally apply to other systems, including systems having architectures dissimilar to that illustrated in FIG. 9. The electronic system 900, in various embodiments, may be implemented as, for example, a general purpose computer, a router, a large-scale data storage system, a portable computer, a personal digital assistant, a cellular telephone, an electronic entertainment device, such as a music or video playback device or electronic game, a microprocessor, a microcontroller, a digital signal processor, or a radio frequency identification device. Any or all of the components depicted in FIG. 9 may employ a phase change memory or chalcogenide electronic device, such as a chalcogenide-based nonvolatile memory and/or threshold switch, for example.

In an illustrative embodiment, the system 900 may include a central processing unit (CPU) 905, which may be implemented with some or all of a microprocessor, a random access memory (RAM) 910 for temporary storage of information, and a read only memory (ROM) 915 for permanent storage of information. A memory controller 920 is provided for controlling RAM 910. In accordance with the principles of the present invention, all of, or any portion of, any of the memory elements (e.g. RAM or ROM) may be implemented as chalcogenide-based nonvolatile memory.

An electronic system 900 in accordance with the principles of the present invention may be a microprocessor that operates as a CPU 905, in combination with embedded chalcogenide-based electronic nonvolatile memory that operates as RAM 910 and/or ROM 915, or as a portion thereof. In this illustrative example, the microprocessor/chalcogenide-nonvolatile memory combination may be standalone, or may operate with other components, such as those of FIG. 9 yet-to-be described.

In implementations within the scope of the invention, a bus 930 interconnects the components of the system 900. A bus controller 925 is provided for controlling bus 930. An interrupt controller 935 may or may not be used for receiving and processing various interrupt signals from the system components. Such components as the bus 930, bus controller 925, and interrupt controller 935 may be employed in a large-scale implementation of a system in accordance with the principles of the present invention, such as that of a standalone computer, a router, a portable computer, or a data storage system, for example.

Mass storage may be provided by diskette 942, CD ROM 947, or hard drive 952. Data and software may be exchanged with the system 900 via removable media such as diskette 942 and CD ROM 947. Diskette 942 is insertable into diskette drive 941 which is, in turn, connected to bus 930 by a controller 940. Similarly, CD ROM 947 is insertable into CD ROM drive 946 which is, in turn, connected to bus 930 by controller 945. Hard disc 952 is part of a fixed disc drive 951 which is connected to bus 930 by controller 950. Although conventional terms for storage devices (e.g., diskette) are being employed in this description of a system in accordance with the principles of the present invention, any or all of the storage devices may be implemented using chalcogenide-based nonvolatile memory in accordance with the principles of the present invention. Removable storage may be provided by a nonvolatile storage component, such as a thumb drive, that employs a chalcogenide-based nonvolatile memory in accordance with the principles of the present invention as the storage medium. Storage systems that employ chalcogenide-based nonvolatile memory as "plug and play" substitutes for conventional removable memory, such as disks or CD ROMs or thumb drives, for example, may emulate existing controllers to provide a transparent interface for controllers such as controllers 940, 945, and 950, for example.

User input to the system 900 may be provided by any of a number of devices. For example, a keyboard 956 and mouse 957 are connected to bus 930 by controller 955. An audio transducer 996, which may act as both a microphone and/or a speaker, is connected to bus 930 by audio controller 997, as illustrated. Other input devices, such as a pen and/or tabloid may be connected to bus 930 and an appropriate controller and software, as required, for use as input devices. DMA controller 960 is provided for performing direct memory access to RAM 910, which, as previously described, may be implemented in whole or part using chalcogenide-based nonvolatile memory devices in accordance with the principles of the present invention. A visual display is generated by video controller 965 which controls display 970. The display 970 may be of any size or technology appropriate for a given application.

In a cellular telephone or portable entertainment system embodiment, for example, the display 970 may include one or more relatively small (e.g. on the order of a few inches per side) LCD displays. In a large-scale data storage system, the display may be implemented as large-scale multi-screen, liquid crystal displays (LCDs), or organic light emitting diodes (OLEDs), including quantum dot OLEDs, for example.

The system 900 may also include a communications adaptor 990 which allows the system to be interconnected to a local area network (LAN) or a wide area network (WAN), schematically illustrated by bus 991 and network 995. An input interface 999 operates in conjunction with an input device 993 to permit a user to send information, whether command and control, data, or other types of information, to the system 900. The input device and interface may be any of a number of common interface devices, such as a joystick, a touch-pad, a touch-screen, a speech-recognition device, or other known input device. In some embodiments of a system in accordance with the principles of the present invention, the adapter 990 may operate with transceiver 973 and antenna 975 to provide wireless communications, for example, in cellular telephone, RFID, and wifi computer implementations.

Operation of system 900 is generally controlled and coordinated by operating system software. The operating system controls allocation of system resources and performs tasks such as processing scheduling, memory management, networking, and I/O services, among other things. In particular, an operating system resident in system memory and running on CPU 905 coordinates the operation of the other elements of the system 900. In illustrative handheld electronic device embodiments of a system 900 in accordance with the principles of the present invention, such as a cellular telephone, a personal digital assistance, a digital organizer, a laptop computer, a handheld information device, a handheld entertainment device such as a device that plays music and/or video, small-scale input devices, such as keypads, function keys and soft keys, such as are known in the art, may be substituted for the controller 955, keyboard 956 and mouse 957, for example. Embodiments with a transmitter, recording capability, etc., may also include a microphone input (not shown).

In an illustrative RFID transponder implementation of a system 900 in accordance with the principles of the present invention, the antenna 975 may be configured to intercept an interrogation signal from a base station at a frequency $F_1$. The intercepted interrogation signal would then be conducted to a tuning circuit (not shown) that accepts signal $F_1$ and rejects all others. The signal then passes to the transceiver 973 where the modulations of the carrier $F_1$ comprising the interrogation signal are detected, amplified and shaped in known fashion. The detected interrogation signal then passes to a decoder and logic circuit which may be implemented as discrete logic in a low power application, for example, or as a microprocessor/memory combination as previously described. The interrogation signal modulations may define a code to either read data out from or write data into a chalcogenide-based nonvolatile memory in accordance with the principles of the present invention. In this illustrative embodiment, data read out from the memory is transferred to the transceiver 973 as an "answerback" signal on the antenna 975 at a second carrier frequency $F_2$. In passive RFID systems power is derived from the interrogating signal and memory such as provided by a chalcogenide-based nonvolatile memory in accordance with the principles of the present invention is particularly well suited to such use.

I claim:

1. An apparatus, comprising:
a phase change memory cell; and
programming circuitry configured to supply a plurality of fixed-voltage programming pulses to program the phase change memory cell to a target threshold voltage.

2. The apparatus of claim 1 wherein the programming circuitry is configured to supply a burst of fixed-voltage programming pulses, with at least one subsequent pulse within the burst being of longer duration than the first pulse within the burst.

3. The apparatus of claim 2 wherein each pulse within a burst is of greater duration than the preceding pulse within the burst.

4. The apparatus of claim 1 wherein the programming circuitry includes a pulse generator configured to generate bursts of fixed-voltage programming pulses, each pulse within a burst having the same fixed-voltage, the voltage level of at least two different bursts having different voltages.

5. The apparatus of claim 1 wherein the programming circuitry includes a pulse selector configured to select among the fixed-voltage pulse bursts and to direct the selected pulse bursts to the phase change memory cell.

6. The apparatus of claim 3 wherein the increase in pulse width from pulse to pulse is correlated with an error bar of the phase change memory cell's memory storage levels.

7. The apparatus of claim 6 wherein the minimum pulse width is correlated with the energy required to program the most readily programmed cell within an array of phase change memory cells to the lowest programming level.

8. The apparatus of claim 7 wherein the maximum pulse width is correlated with the energy required to program the least readily programmed phase change memory cell in an array of phase change memory cells to the highest programming level.

9. The apparatus of claim 8 wherein the number of pulses within a burst is at least the difference between the durations of the narrowest and widest pulses within a burst divided by the increase in duration of pulse width between successive pulses within a burst.

10. The apparatus of claim 1 wherein a SET pulse is appended to the front of each fixed-voltage pulse burst.

11. An apparatus, comprising:
a fixed-voltage pulse generator configured to generate fixed-voltage pulse bursts, the fixed-voltage pulse generator further configured to generate pulse bursts of at least two different voltage amplitudes; and
a selector configured to select among the fixed-voltage pulse bursts, wherein the selector is further configured to direct the selected pulse bursts to a phase change memory cell.

12. The apparatus of claim 11 further comprising a phase change memory cell configured to accept fixed-voltage pulse bursts from said selector.

13. A method, comprising the steps of:
supplying a programming pulse to a phase change memory cell, the programming pulse characterized by a fixed voltage and width; and
supplying a second programming pulse to the phase change memory cell, the second programming pulse characterized by the same fixed voltage as the first and a width that is greater than the first.

14. The method of claim 13 further comprising the step of: supplying a burst of fixed-voltage programming pulses, wherein each pulse within a burst is of greater duration than the preceding pulse within the burst.

15. The method of claim 13 further comprising the step of: supplying bursts of fixed-voltage programming pulses, each pulse within a burst having the same fixed-voltage, the voltage level of at least two different bursts having different voltages.

16. The method of claim 15 further comprising the step of: selecting among the fixed-voltage pulse bursts and directing the selected pulse bursts to the phase change memory cell.

17. The method of claim 15 further comprising the step of: correlating the increase in pulse width from pulse to pulse with an error bar of the phase change memory cell's programmed memory storage levels.

18. The method of claim 17 further comprising the step of correlating the minimum pulse width with the energy required to program the most readily programmed phase change memory cell within an array of phase change memory cells to the lowest programming level.

19. The method of claim 18 further comprising the step of correlating the maximum pulse width with the energy required to program the least readily programmed phase change memory cell in an array of phase change memory cells to the highest programming level.

20. The method of claim 19 further comprising the step of correlating the number of pulses within a burst with the difference between the durations of the narrowest and widest pulses within a burst.

21. The method of claim 20 further comprising the step of appending a SET pulse to the front of each fixed-voltage pulse burst.

22. An electronic device, comprising:
 a fixed-voltage pulse generator configured to generate fixed-voltage pulse bursts, the fixed-voltage pulse generator further configured to generate pulse bursts of at least two different voltage amplitudes;
 a selector configured to select among the fixed-voltage pulse bursts, wherein the selector is further configured to direct the selected pulse bursts to a phase change memory cell; and
 a microprocessor configured to access the phase change memory cell.

23. The electronic device of claim 22 further comprising a transmitter/receiver configured to transmit data from and receive data for the microprocessor and/or the phase change memory cell.

24. The electronic device of claim 23 wherein the memory, microprocessor and transmitter/receiver are configured as a cellular telephone.

25. The electronic device of claim 22 wherein the memory, and microprocessor are configured as a handheld entertainment device.

26. A method of reading a phase change memory, comprising the steps of:
 determining the threshold voltage of a phase change memory; and
 correlating the threshold voltage of the phase change memory with a storage level.

27. The method of claim 26, wherein the step of determining the threshold voltage of the phase change memory includes the step of detecting the peak voltage across the phase change memory during the read operation.

28. The method of claim 27 wherein the step of detecting the peak voltage across the phase change memory includes the step of applying an increasing ramp voltage to the phase change memory.

29. The method of claim 26 wherein the step of correlating the threshold voltage of the phase change memory further comprises assigning a range of threshold voltages to each storage level in a multi-level memory.

30. A phase change memory comprising:
 a phase change memory cell;
 circuitry configured to determine the threshold voltage of the phase change memory cell; and
 circuitry configured to correlate the threshold voltage of the phase change memory cell with a storage level.

31. The memory of claim 30, wherein the circuitry configured to determine the threshold voltage of the phase change memory cell further comprises circuitry configured to detect the peak voltage across the phase change memory cell during a read operation.

32. The memory of claim 31 wherein the circuitry configured to determine the threshold voltage of the phase change memory cell further comprises circuitry configured to apply an increasing ramp voltage to the phase change memory cell.

33. The memory of claim 30 wherein the circuitry configured to correlate the threshold voltage of the phase change memory cell further comprises circuitry configured to assign a range of threshold voltages to each storage level in a multi-level memory.

* * * * *